US012694935B2

(12) United States Patent
Jo

(10) Patent No.: US 12,694,935 B2
(45) Date of Patent: Jul. 28, 2026

(54) MEMORY DEVICE AND OPERATION METHOD FOR IMPROVING A READ OPERATION

(71) Applicant: SK hynix Inc., Gyeonggi-do (KR)

(72) Inventor: Eun Woo Jo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 148 days.

(21) Appl. No.: 18/663,104

(22) Filed: May 14, 2024

(65) Prior Publication Data

US 2025/0201314 A1 Jun. 19, 2025

(30) Foreign Application Priority Data

Dec. 15, 2023 (KR) ........................ 10-2023-0183450

(51) Int. Cl.
| *G11C 7/22* | (2006.01) |
| *G11C 16/04* | (2006.01) |
| *G11C 16/24* | (2006.01) |
| *G11C 16/26* | (2006.01) |

(52) U.S. Cl.
CPC .......... *G11C 16/26* (2013.01); *G11C 16/0483* (2013.01); *G11C 16/24* (2013.01)

(58) Field of Classification Search
CPC ..... G11C 16/26; G11C 16/0483; G11C 16/24; G11C 16/08; G11C 16/10; G11C 16/06; G11C 16/045
USPC .................................................... 365/189.011
See application file for complete search history.

(56) References Cited

U.S. PATENT DOCUMENTS

| 8,320,184 | B2 * | 11/2012 | Yang | .................. | G11C 16/0483 |
| | | | | | 365/185.17 |
| 12,136,458 | B2 * | 11/2024 | Nakagawa | ............. | G11C 16/10 |
| 2016/0093391 | A1 | 3/2016 | Shim | | |
| 2017/0271021 | A1 * | 9/2017 | Futatsuyama | .......... | G11C 16/10 |
| 2020/0202961 | A1 | 6/2020 | Chen et al. | | |

* cited by examiner

*Primary Examiner* — Tha-O H Bui
(74) *Attorney, Agent, or Firm* — IP & T GROUP LLP

(57) ABSTRACT

A memory device includes a cell array and a control circuit. The cell array includes a drain select line, a bit line and a cell string including plural memory cells. The control circuit is configured to sense data stored in a selected cell among the plural memory cells in the cell string and apply a first negative voltage to the drain select line while performing equalization for the plural memory cells.

20 Claims, 12 Drawing Sheets

MEMORY DEVICE AND OPERATION METHOD FOR IMPROVING A READ OPERATION

CROSS-REFERENCE TO RELATED APPLICATIONS

This patent application claims the benefit of priority under 35 U.S.C. § 119 to Korean Patent Application No. 10-2023-0183450 filed on Dec. 15, 2023, the entire disclosure of which is incorporated herein by reference.

TECHNICAL FIELD

One or more embodiments of the present disclosure relate to a memory device, a memory system including the memory device, and an operation method thereof, and more particularly, to an apparatus and an operation method for improving a read operation performed within the memory device.

BACKGROUND

A data processing system includes a memory system or a data storage device. The data processing system can be developed to store more voluminous data in the data storage device, store data in the data storage device faster, and read data stored in the data storage device faster. The memory system or the data storage device can include non-volatile memory cells and/or volatile memory cells for storing data.

SUMMARY

An embodiment of the present disclosure can provide a memory system including a memory device, a data processing system including the memory system, and an operation process or a method, which may quickly and reliably process data into a memory device by reducing operational complexity and performance degradation of the memory system, thereby enhancing usage efficiency of the memory device.

An embodiment of the present disclosure can provide a memory device, including a cell array in which electronic connection between a bit line and a cell string comprising plural memory cells is controlled by a drain select line (DSL) and a control circuit configured to sense data stored in a selected cell among the plural memory cells in the cell string and apply a first negative voltage to the drain select line while performing equalization for the plural memory cells.

The cell array can include a global drain select line coupled to plural drain select lines including the drain select line; and a first switch configured to selectively couple the global drain select line to a P-type well in which the plural memory cells are formed.

The P-type well can be formed in a N-type well included in a P-type substrate.

The control circuit may apply a second negative voltage to the P-type well while performing the equalization for the plural memory cells.

The first negative voltage and the second negative voltage can have a same level.

The memory device can further include a second switch configured to selectively couple the global drain select line to a ground voltage. The control circuit may apply the ground voltage to the global drain select line through the second switch after performing the equalization for the plural memory cells.

The control circuit may apply a ground voltage to the drain select line for discharging a channel of the cell string after performing the equalization for the plural memory cells.

The control circuit may apply two read voltages having different levels to a selected word line coupled to the selected cell for sensing the data; and apply a pass voltage to unselected word lines while the two read voltages are applied to the selected word line.

The control circuit may apply a preset voltage having a lower level than the pass voltage to the selected word line and the unselected word lines while performing the equalization for the plural memory cells.

The control circuit may apply a ground voltage to the selected word line and the unselected word lines for discharging a channel of the cells string after performing the equalization for the plural memory cells.

An embodiment of the present disclosure can provide a method for operating a memory device, including sequentially applying two read voltages having different levels to a selected word line coupled to a selected memory cell among plural memory cells to sense data stored in the selected memory cell, and applying a first negative voltage to a drain select line while performing equalization for the plural memory cells.

The method can further include applying an activation voltage to the drain select line to couple the selected memory cell to a bit line while the data is sensed.

The method can further include coupling the drain select line to a global drain select line at a timing of starting the equalization for the plural memory cells; and applying a second negative voltage to a P-type well in which a transistor coupled to the drain select line is formed, while performing the equalization for the plural memory cells.

The first negative voltage and the second negative voltage can have a same level.

The method can further include, after performing the equalization for the plural memory cells, applying a ground voltage to the selected word line, the drain select line, and the P-type well to discharge charges in a channel formed on the plural memory cells.

An embodiment of the present disclosure can provide a memory device, including plural drain select lines coupled to plural cell strings, respectively; a global drain select line coupled to the plural drain select lines; a first switch configured to selectively couple the global drain select line to a P-type well in which a transistor coupled to at least one of the plural drain select lines is formed; and a second switch configured to selectively apply a ground voltage to the global drain select line.

The memory device can further include a control circuit configured to sense data stored in a selected cell of the selected cell string and apply a first negative voltage to a selected drain select line while performing equalization for a selected cell string coupled to the selected drain select line.

The control circuit may turn on the first switch and turn off the second switch while performing the equalization for the selected cell string.

The control circuit may turn off the first switch and turn on the second switch for discharging a channel of the selected cell string after performing the equalization for the selected cell string.

The P-type well can be formed in a N-type well included in a P-type substrate. The control circuit may apply a second negative voltage to the P-type well while performing the equalization for the selected cell string.

BRIEF DESCRIPTION OF THE DRAWINGS

The description herein makes reference to the accompanying drawings wherein like reference numerals refer to like parts throughout the figures.

FIG. 2 describes a memory cell array according to an embodiment of the present disclosure.

FIG. 10 describes changes in configuration and operation method of a memory device according to an embodiment of the present disclosure.

DETAILED DESCRIPTION

Figure 1:
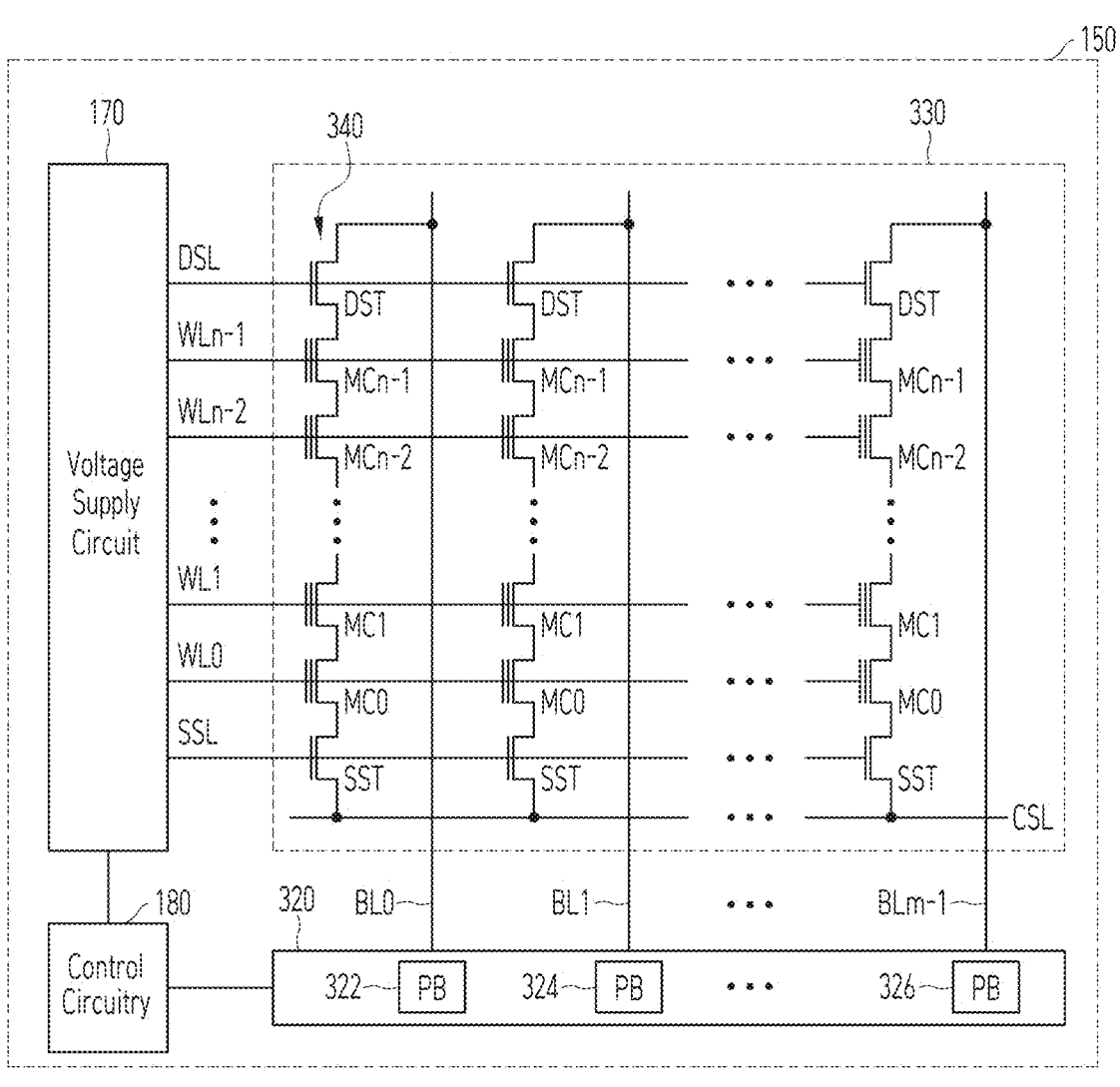
FIG. 1 describes a memory device according to an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components e.g., an interface unit, circuitry, etc.

In this disclosure, various units, circuits, or other components may be described or claimed as "configured to" perform a task or tasks. In such contexts, "configured to" is used to connote structure by indicating that the blocks/units/ circuits/components include structure (e.g., circuitry) that performs one or more tasks during operation. As such, the block/unit/circuit/component can be said to be configured to perform the task even when the specified block/unit/circuit/component is not currently operational, e.g., is not turned on nor activated.

Examples of block/unit/circuit/component used with the "configured to" language include hardware, circuits, memory storing program instructions executable to implement the operation, etc. Additionally, "configured to" can include a generic structure, e.g., generic circuitry, that is manipulated by software and/or firmware, e.g., an FPGA or a general-purpose processor executing software to operate in a manner that is capable of performing the task(s) at issue. "Configured to" may also include adapting a manufacturing process, e.g., a semiconductor fabrication facility, to fabricate devices, e.g., integrated circuits that are adapted to implement or perform one or more tasks.

As used in this disclosure, the term 'machine,' 'circuitry' or 'logic' refers to all of the following: (a) hardware-only circuit implementations such as implementations in only analog and/or digital circuitry and (b) combinations of circuits and software and/or firmware, such as (as applicable): (i) to a combination of processor(s) or (ii) to portions of processor(s)/software including digital signal processor(s), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'machine,' 'circuitry' or 'logic' applies to all uses of this term in this application, including in any claims. As a further example, as used in this application, the term 'machine,' 'circuitry' or 'logic' also covers an implementation of merely a processor or multiple processors or portion of a processor and its (or their) accompanying software and/or firmware. The term 'machine,' 'circuitry' or 'logic' also covers, for example, and if applicable to a particular claim element, an integrated circuit for a storage device.

As used herein, the terms 'first,' 'second,' 'third,' and so on are used as labels for nouns that they precede, and do not imply any type of ordering, e.g., spatial, temporal, logical, etc. The terms 'first' and 'second' do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term 'based on' is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Herein, a data entry, an entry of data, an item of data, or a data item may be a sequence of bits. For example, the data entry may include the contents of a file, a portion of the file, a page in memory, an object in an object-oriented program, a digital message, a digital scanned image, a part of a video or audio signal, metadata or any other entity which can be represented by a sequence of bits. According to an embodiment, the data entry may include a discrete object. According to another embodiment, the data entry may include a unit of information processed or handled for a data input/output operation. According to yet another embodiment, the data entry may include a unit of information within a transmission packet between two different components.

Embodiments will now be described with reference to the accompanying drawings, wherein like numbers reference like elements.

FIG. 1 illustrates a memory device 150 according to an embodiment of the present disclosure. Specifically, FIG. 1 illustrates a memory cell group (e.g., a cell array) included in a memory plane or a memory die included in the memory device 150 according to an embodiment of the present disclosure.

Referring to FIG. 1, the memory device 150 may include at least one memory group 330 having a plurality of cell strings 340. Each cell string 340 may include a plurality of non-volatile memory cells MC0 to MCn−1 connected to a respective bit line of a plurality of bit lines BL0 to BLm−1. The cell strings 340 are disposed in respective columns of the memory group 330, and each cell string 340 can include at least one drain select transistor DST and at least one source select transistor SST.

The non-volatile memory cells MC0 to MCn−1 of each cell string 340 may be connected in series between a drain select transistor DST and a source select transistor SST. Each of the non-volatile memory cells MC0 to MCn−1 may be configured as a multi-level cell (MLC) that stores a data item having plural bits per cell. The cell strings 340 may be electrically connected to corresponding bit lines of the bit lines BL0 to BLm−1.

In an embodiment, the memory group 330 may include NAND-type flash memory cells MC0 to MCn−1 shown in FIG. 1. In another embodiment, the memory group 330 can be implemented as a NOR-type flash memory, a hybrid flash memory in which at least two different types of memory cells are mixed or combined, or a one-chip NAND flash memory in which a controller is embedded in a single memory chip. In an embodiment, the memory group 330 can include a flash memory cell including a charge trap flash (CTF) layer that includes a conductive floating gate or insulating layer.

According to an embodiment, the memory device 150 shown in FIG. 1 can include at least one memory block. The memory group 330 can have a two-dimensional (2D) or three-dimensional (3D) structure. For example, each of the memory blocks in the memory device 150 may be implemented as a 3D structure, for example, a vertical structure. Each of the memory blocks may have a three-dimensional structure extending along first to third directions, for example, an x-axis direction, a y-axis direction, and a z-axis direction.

The memory group 330 including at least one memory block can be coupled to a plurality of bit lines BL, a plurality of source select lines SSL, a plurality of drain select lines DSL, a plurality of word lines WL, a plurality of dummy word lines DWL, and a plurality of common source lines CSL. In an embodiment, the memory group 330 can include a plurality of NAND strings NS which, for example, may respectively correspond to cell strings 340. Each NAND string NS may include a plurality of memory cells MC and may be connected to a respective bit line of the bit lines BL. In addition, the source select transistor SST of each NAND string NS may be connected to a common source line CSL, and the drain select transistor DST of each NAND string NS can be connected to a corresponding bit line BL. In each NAND string NS, the memory cells MC may be arranged between the source select transistor SST and the drain select transistor DST.

The memory device 150 may include a voltage supply circuit 170 which can supply a word line voltage e.g., one or more predetermined voltages such as a program voltage, a read voltage, and a pass voltage, for respective word lines of the word lines according to an operation mode, or may supply a voltage to a bulk, e.g., a well region, in which each memory block including the memory cells MC are formed. In this case, a voltage generating operation of the voltage supply circuit 170 may be performed under control of a control circuitry 180. Also, the voltage supply circuit 170 may generate a plurality of variable read voltages to distinguish a plurality of data items from each other.

Under the control of the control circuitry 180, one of the memory blocks (or sectors) of the memory cell array may be selected, and one of the word lines of the selected memory block may be selected. Word line voltages may be supplied to the selected word line and the unselected word line of the memory group 330, individually. The voltage supply circuit 170 may include a voltage generation circuit for generating target voltages having various levels, which are applicable to word lines of the memory group 330.

The memory device 150 may also include a read/write circuit 320 controlled by the control circuitry 180. The read/write circuit 320 may operate as a sense amplifier or a write driver according to an operation mode. For example, in a verify operation and a read operation, the read/write circuit 320 may operate as a sense amplifier for reading the data item from the memory cell array. In a program operation, the read/write circuit 320 may operate as a write driver that controls potentials of bit lines according to a data item to be stored in the memory cell array. The read/write circuit 320 may receive the data item to be programmed to the cell array from page buffers during the program operation. The read/write circuit 320 can drive bit lines based on the input data item. To this end, the read/write circuit 320 may include a plurality of page buffers (PB) 322, 324, 326, with each page buffer corresponding to each column or each bit line, or each column pair or each bit line pair. According to an embodiment, a plurality of latches may be included in each of the page buffers 322, 324, 326. According to an embodiment, the number of latches or page buffers coupled to each bit line can be equal to, or greater than, the number of bits of data stored in the memory cells MC.

The page buffers 322, 324, 326 may be coupled to a data input/output device, e.g., a serialization circuit or a serializer, through a plurality of buses BUS. When each of the page buffers 322, 324, 326 is coupled to the data input/output device through different buses, a delay that may occur in data transmission from the page buffers 322, 324, 326 can be reduced. For example, each page buffer 322, 324, 326 can perform the data transmission without a waiting time.

According to an embodiment, the memory device 150 may receive a write command, write data, and information, e.g., a physical address, regarding a location in which the write data is to be stored. The control circuitry 180 causes the voltage supply circuit 170 to generate a program pulse, a pass voltage, etc., used for a program operation performed in response to a write command, and to generate one or more voltages used for a verification operation performed after the program operation.

When a multi-bit data item is programmed in non-volatile memory cells included in the memory group 330, the error rate may be higher than that when a single-bit data item is stored in the non-volatile memory cells. For example, an error in the non-volatile memory cells may be induced due to cell-to-cell interference (CCI). To reduce errors in the non-volatile memory cells, a width (deviation) of a threshold voltage distribution, corresponding to stored data items between the non-volatile memory cells, should be reduced.

To this end, the memory device 150 can perform an incremental step pulse programming (ISPP) operation to effectively make a narrow threshold voltage distribution of the non-volatile memory cells. In an embodiment, the memory device 150 can use the ISPP operation for multi-step program operations. For example, the memory device 150 may divide a program operation into a Least Significant Bit (LSB) program operation and a Most Significant Bit (MSB) operation according to a predetermined order between the non-volatile memory cells or pages.

A multi-bit value programmed in a memory cell in a NAND flash memory (e.g., NAND-type flash memory cells MC0 to MCn–1 in the memory group 330) can be determined based on a threshold voltage window or a threshold voltage distribution to which the cell's threshold voltage belongs. As a size of each memory cell shrinks and more bits (e.g., 3-bit, 4-bit, or 5-bit) of data are programmed per memory cell, a width of the threshold voltage window used to represent each multi-bit value becomes narrower, increasing an error rate when determining the multi-bit value stored in the memory cell. This is because process variations become more widespread when an amount of charge stored in each memory cell decreases with a feature size, resulting in large differences in threshold voltages of different memory cells storing the same value. As a result, it becomes increasingly difficult to determine which value a threshold voltage of a memory cell corresponds to.

According to an embodiment, the control circuitry 180 may include a read retry table (RRT). The RRT may be stored in the memory device 150. A read error may occur in a process of applying a read voltage to a non-volatile memory cell in the memory device 150 through a word line and reading data stored in the non-volatile memory cell. The control circuitry 180 in the memory device 150 may manage information regarding a read retry mechanism for resolving read errors. One component of the information regarding the read retry mechanism is the read RRT. The read retry mechanism uses the RRT for a recorded location where the error has occurred, so that the memory device 150 can ensure data integrity by applying an appropriate correction value (e.g., changing a read voltage level) when re-reading.

Figure 2:
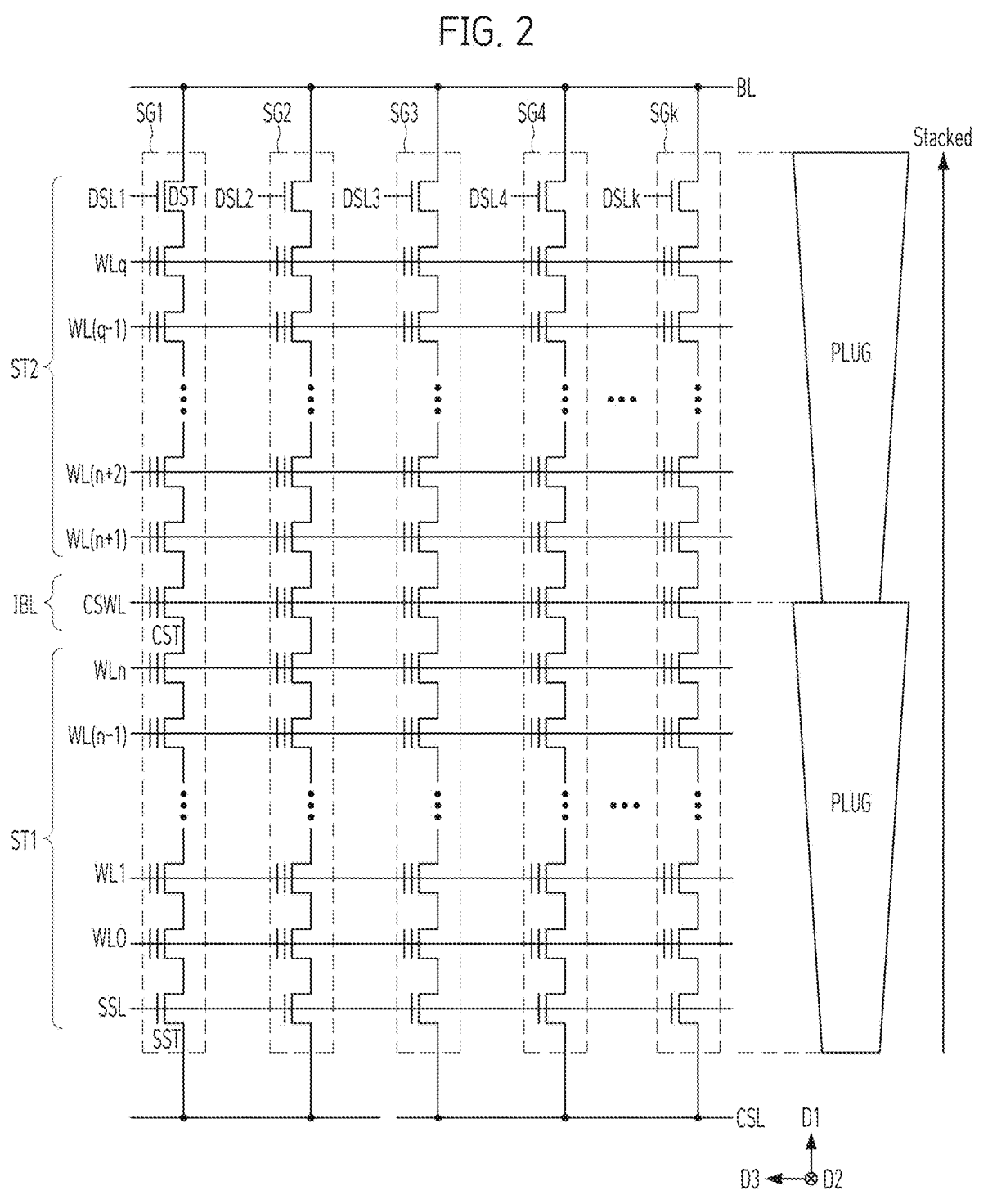

FIG. 2 illustrates a memory cell array according to an embodiment of the present disclosure.

Referring to FIG. 2, the memory cell array may have a structure including portions or layers stacked in a vertical direction D1. The memory cell array may include at least one memory block. Hereinafter, a direction substantially perpendicular to the upper surface of the substrate may be defined as a first direction D1, and two directions parallel to the upper surface of the substrate and intersecting each other may be defined as the second direction D2 and the third direction D3, individually. For example, the second direction D2 and the third direction D3 may intersect each other substantially perpendicularly. The first direction D1 may be referred to as a vertical direction, the second direction D2 may be referred to as a row direction, and the third direction D3 may be referred to as a column direction. The direction indicated by the arrow in the drawing and the direction opposite to it are described as the same direction.

For convenience of description, FIG. 2 shows NAND strings or cell strings SG1 to SGk connected to one bit line BL and one common source line CSL among the cell strings included in the memory block.

The memory block may include a plurality of cell strings SG1 to SG5 connected between the same bit line (BL) and the common source line CSL. Each of the cell strings SG1 to SGk can include at least one source select transistor SST controlled by a source select line SSL, plural memory cells controlled by word lines WL, a central switching transistor CST disposed in an intermediate boundary layer IBL and controlled by a central switching word line CSWL, and a drain select transistor DST controlled by each drain select line DSL1, DSL2, DSL3, . . . , DSLk.

According to an embodiment, plural memory cells connected to at least one word line located at both ends of first and second stacks ST1, ST2 in the first direction D1 may be dummy cells. Any data may not be stored in the dummy cells. Further, according to an embodiment, the dummy cells may be used to store data having a smaller number of bits than other memory cells. According to an embodiment, the intermediate boundary layer IBL may include at least one gate line. One gate line corresponds to the central switching word line CSWL which can simultaneously control switching operations of the central switching transistors CST connected thereto. Further, although FIG. 2 illustrates a structure in which the first and second stacks ST1, ST2 are stacked, three or more stacks may be vertically stacked in the cell array 330. When a plurality of stacks are stacked, an intermediate boundary layer IBL may be formed and disposed between each two stacked stacks. The intermediate boundary layer IBL may include at least one switching transistor configured to couple memory cells in one stack of the two stacks to other memory cells in the other stack.

FIG. 2 shows an embodiment in which the source select transistors SST included in the plurality of cell strings SG1 to SGk are connected to the common select line CSL. However, according to an embodiment, a certain number of source select transistors could be coupled to each of plural source ground select lines.

Referring to FIGS. 1 to 2, the cell array 330 can include a plurality of memory blocks arranged along a plurality of directions D1, D2, D3. In an embodiment, a memory block may be selected by the control circuitry 180 shown in FIG. 1. For example, a read voltage, a program voltage, or an erase voltage may be applied to a memory block and a word line selected by the control circuitry 180.

Each of the cell strings SG1 to SGk may include a plurality of switch transistors as well as a plurality of memory cells capable of storing data. Here, the plurality of switch transistors can include a drain select transistor DST, a source select transistor SST, and a central switching transistor CST. FIG. 2 shows an embodiment in which each of the cell strings SG1 to SGk includes one drain select transistor DST, one source select transistor SST, and one central switching transistor CST, respectively. However, according to an embodiment, each of the cell strings SG1 to SGk may include a plurality of drain select transistors DST, a plurality of source select transistors SST, or a plurality of intermediate switching transistors CST.

Figure 3:
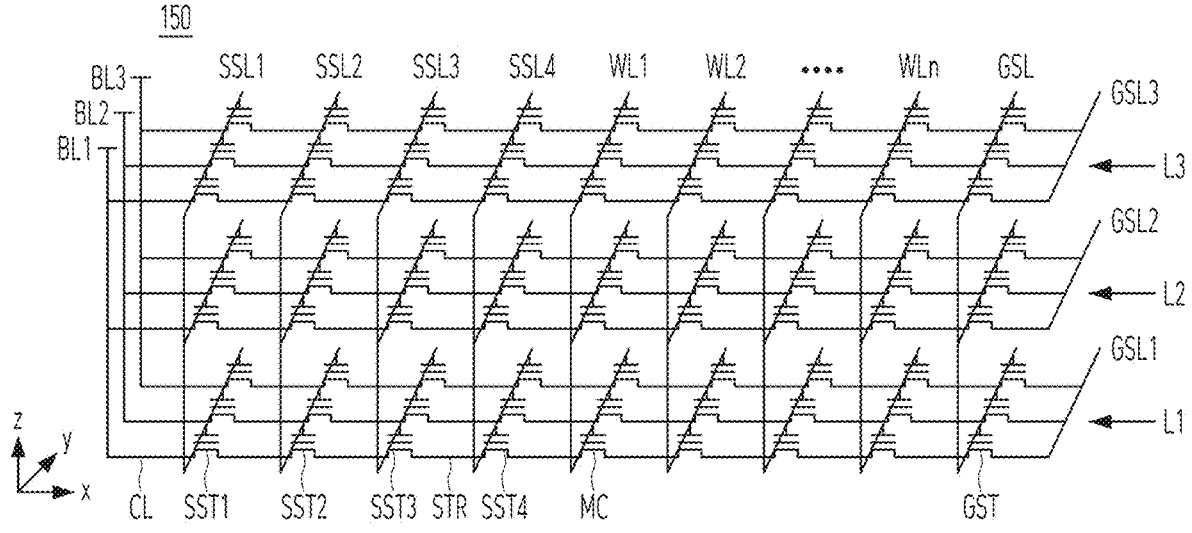
FIG. 3 describes a cell array structure according to an embodiment of the present disclosure.

FIG. 3 shows a cell array structure according to an embodiment of the present disclosure.

Figure 4:
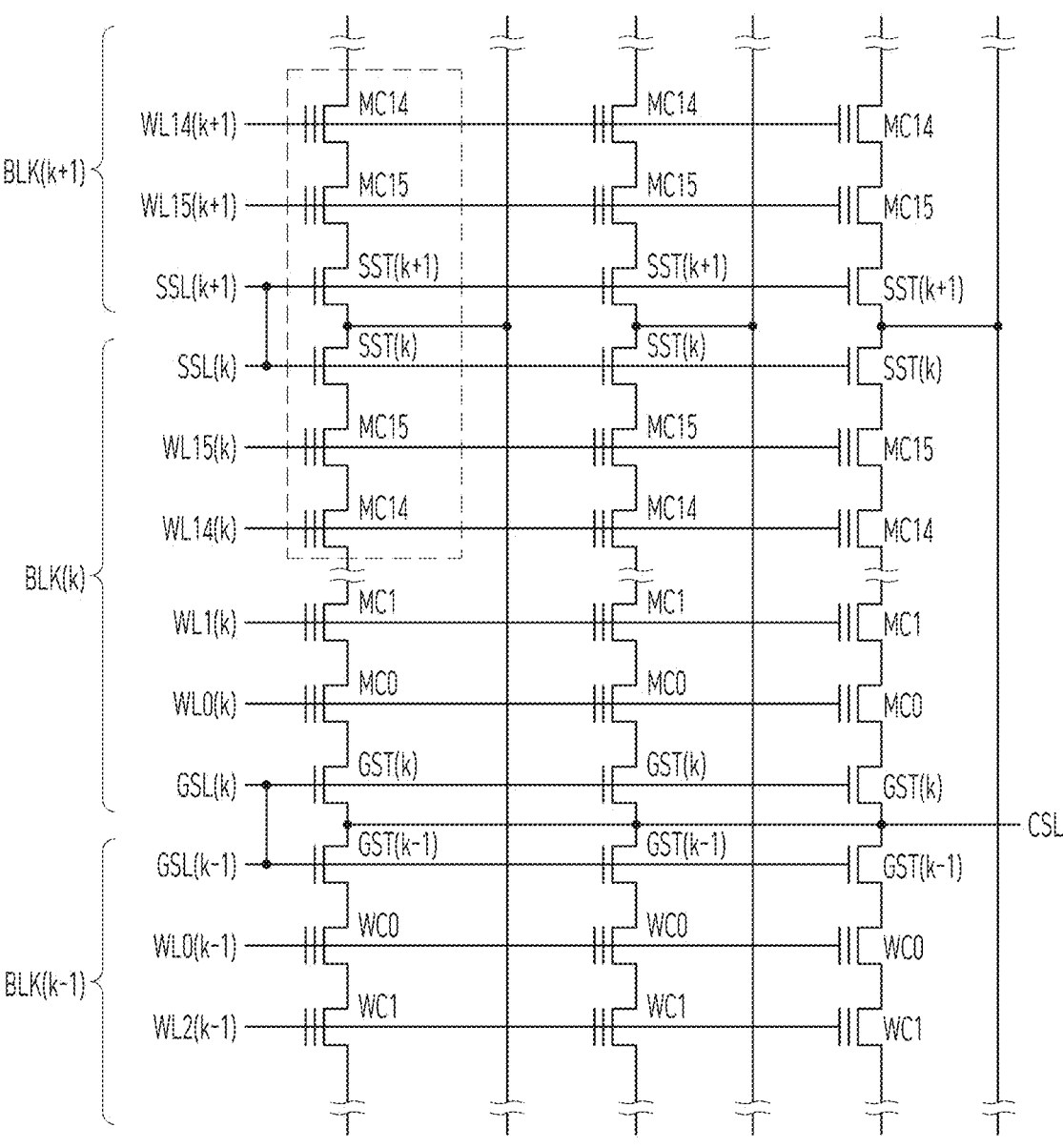
FIG. 4 describes a cell array structure according to an embodiment of the present disclosure.

Referring to FIGS. 3 and 4, the memory device 150 may be stacked in the vertical direction (D1, Z) through a plurality of stacks ST1, ST2, as described in FIG. 2, and non-volatile memory cells can be placed in three-dimensional (3D) space. Specifically, FIG. 3 illustrates a cell array in a 3D non-volatile memory device according to an embodiment of the present disclosure.

The memory device 150 may include a plurality of memory cells MC arranged in a cell string STR in a plurality of memory layers (e.g., three memory layers L1, L2, L3). Each memory layer L1, L2, L3 is connected to a plurality of bit lines BL1, BL2, BL3 through a first end of the plurality of channel lines CL and to the common source line CSL through a second end of the plurality of channel lines CL. The memory device 150 may include a plurality of source select lines SSL1 to SSL4 connected to source select transistors SST1 to SST3. In addition, a plurality of word lines WL1 to WLn and a ground select line GSL may be connected to each of the memory layers L1, L2, L3. The plurality of source select lines SSL1 to SSL4, the plurality of word lines WL1 to WLn, and the ground select line GSL may be arranged in a direction that intersects a plurality of channel lines CL. Each of the plurality of channel lines may be described as the cell string STR. Each of the cell strings STR may include the source select transistors SST1 to SST4 respectively connected to the plurality of source select lines SSL1 to SSL4. The ground select line GSL may be grounded to turn off the ground selection transistor GST.

The plurality of word lines WL1 to WLn may each be connected to control gates of memory cells arranged in a column direction. Each of the plurality of bit lines BL1 to BL3 may be connected to one end of the source select transistors. A plurality of memory cells having control gate electrodes connected to each word line WL1 to WLn in the row direction can configure a page, which is a unit for storing data or a data entry. The number of pages could be changed or determined depending on a storage capacity of the memory cells.

FIG. 4 shows a cell array structure according to an embodiment of the present disclosure. Specifically, FIG. 4 describes an internal configuration of the cell array 330 described in FIG. 1.

Referring to FIGS. 1 and 4, the cell array 330 within the memory device 150 may include a plurality of memory blocks BLK(k+1), BLK(k), BLK(k−1). FIG. 4 illustrates three memory blocks BLK(k+1), BLK(k), BLK(k−1), but the cell array 330 can include a plurality of memory blocks arranged in two or three dimensions. In FIG. 4, each memory block BLK(k+1), BLK(k), BLK(k−1) has plural memory cells coupled to 16 word lines WL0 to WL15. The 16 word lines WL0 to WL15 and a ground select line GSL in a direction perpendicular to a row or a bit line could be placed in parallel. However, the number of word lines included in each memory block may vary depending on an embodiment. Each memory block BLK(k+1), BLK(k), BLK(k−1) may include a cell string corresponding to each bit line. In a memory block (e.g., BLK(k)), each cell string may be connected to a ground select transistor GST(k) and a source select transistor SST(k) coupled to the corresponding bit line. The cell string may include 16 memory cells MC15 to MC0 connected in series between a common source line CSL and the source and ground select transistors SST(k), GST(k). The number of memory cells included in the cell string may correspond to the number of word lines. The source select transistor SST(k), the memory cells MC15 to MC0, and the ground select transistor GST(k) are individually connected to a source select line SSL(k), the word lines WL15 to WL0, and a ground select line GSL(k).

Referring to FIGS. 1 to 4, as the memory device 150 is designed to store more data, source select lines of adjacent memory blocks arranged in two or three dimensions may be electrically connected to each other. Further, the ground select lines for the adjacent memory blocks may be electrically connected to each other. For example, the source select line SSL(k) of the memory block BLK(k) may be electrically connected to the source select line SSL(k+1) of the adjacent memory block BLK(k+1). Further, adjacent string/ ground select transistors along a bit line can share a contact to achieve electrical connection between adjacent string/ ground select lines.

When designed to share a ground select line or a cell string between adjacent memory blocks, the disturb effect resulting from a read or write operation performed on a specific memory block can affect adjacent memory blocks (e.g., memory blocks with shared cell strings but not selected). Here, a scheme in which cell strings are shared between adjacent memory blocks can include a structure in which cell strings share a same component using an electrode or a functional layer such as any area or any semiconductor layer stacked on the semiconductor substrate or a body electrode formed in a trench of the semiconductor substrate where the cell strings are formed. Additionally, when designed to share a ground select line or a cell string for adjacent memory blocks, the disturb effect due to the read or write operation performed on a specific memory block among the adjacent memory blocks may be greater than a case where the cell string is not shared by the adjacent memory blocks. There is a difference in the read disturb effect according to a read operation on an open memory block depending on whether a cell string is shared by adjacent memory blocks of the memory device 150.

Referring to FIGS. 1 to 4, in order to store more data in the memory device 150, more memory cells may be integrated in a three-dimensional space. As the number of memory cells increases, the number of various control lines (e.g., word lines, drain select lines, source select lines, etc.) connected to the memory cells also increases. As the number of control lines increases, each control line could be layered to improve efficiency and enhance performance. Herein, layering can mean that the memory device 150 is designed to divide the cell array 330 into preset areas and use some layered control lines only in the divided areas.

According to an embodiment, a global control line group (e.g., an upper layered line group) may include a global drain select line, a global word line, and a global source select line. A local control line group (e.g., a lower layered line group) may include a drain select line, a word line, and a source select line. The local control line group may correspond to a single memory block. The global control line group may be coupled to plural local control line groups associated with at least two or more memory blocks.

The global control line group and the local control line group may be coupled through pass switching circuits included in a pass switching block. For example, a global source select line may be coupled to at least one of plural source select lines included in at least two local control line groups through a pass switching circuit. The global drain select line may be coupled to at least one of plural drain select lines included in the at least two local control line groups through the pass switching circuit. Each of the global word lines may be coupled to a corresponding word line included in the at least two local control line groups through the pass switching circuit.

A signal that controls the pass switching circuits included in the pass switching block may be a block selection signal. When an activated block selection signal is applied to the pass switching block, the global control line group and the local control line group may be electrically coupled through the pass switching block. When a deactivated block selection signal is applied to the pass switching block, the global control line group and the local control line group may be electrically decoupled through the pass switching block.

Operating voltages applied to the global control line group may be transmitted to the local control line group associated with each memory block coupled through the pass switching block. For example, a voltage applied to the global source select line may be delivered to a source select line associated with at least two local control line groups coupled through the pass switching block. The voltage applied to the global drain select line may be delivered to a drain select line associated with at least two local control line groups coupled through the pass switching block. The voltage applied to each of the global word lines may be delivered to at least one word line at corresponding positions associated with at least two local control line groups coupled through the pass switching block.

Figure 5:
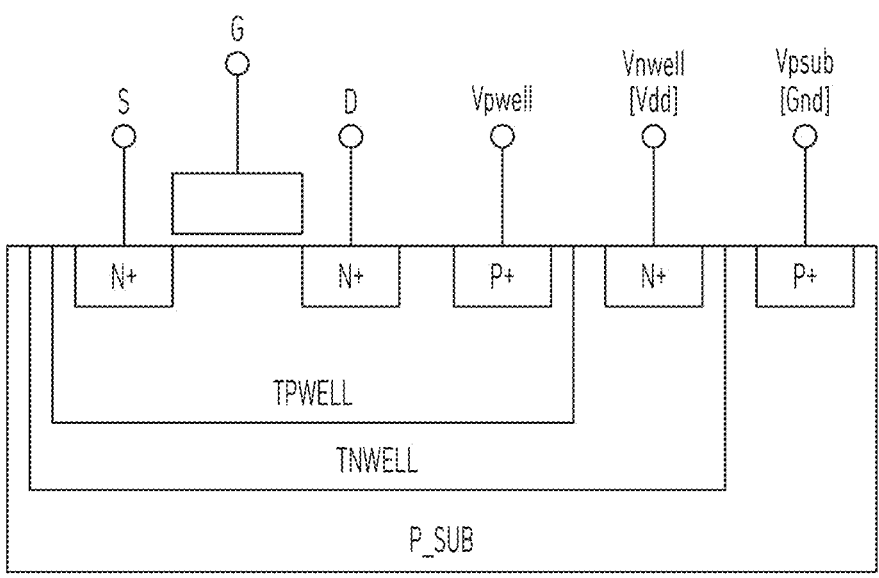
FIG. 5 illustrates a cross section of a cell array according to an embodiment of the present disclosure.

FIG. 5 illustrates a cross section of a cell array according to an embodiment of the present disclosure. Specifically, FIG. 5 is a cross-sectional view of the device to describe a triple well structure of NMOS transistors included in the memory device 150.

According to an embodiment, NMOS transistors within the memory device 150 may be arranged for various purposes. For example, NMOS transistors could be used as a drain select transistor (DST) connected to a drain select line (DSL) or a source select transistor (SST) connected to a source select line (SSL), which is included in the cell array 330.

Referring to FIG. 5, an N-type well (TNWELL) can be formed in a P-type substrate (P sub), and a P-type well (TPWELL) can be formed in the N-type well (TNWELL). Source (S) and drain (D) regions (N+) can be formed in the P-type well (TPWELL). A doped region (P+) for applying a voltage to the P-type well (TPWELL) can be formed. A power supply voltage (e.g., Vdd) can be applied to the N-type well (TNWELL), and the P-type substrate (P sub) can be grounded. While a negative voltage is applied to the source, the region (N+) of the source (S) and the P-type well (TPWELL) could become a PN junction. To avoid forming the PN junction between the region (N+) of the source (S) and the P-type well (TPWELL), a same negative voltage could be applied to the P-type well (TPWELL). Thus, the negative voltage applied to the source (S) could be delivered to the drain (D).

Figure 6:
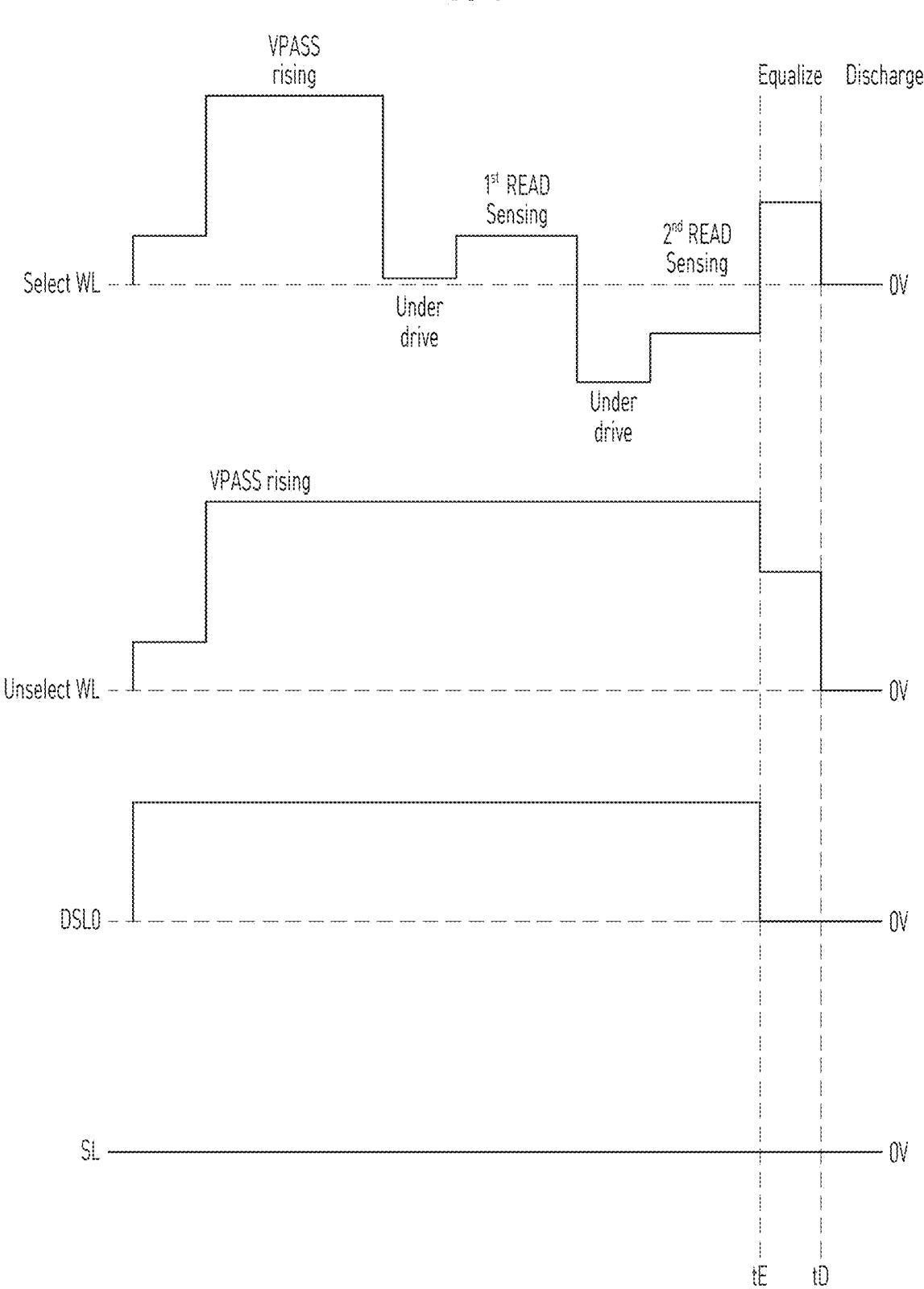
FIG. 6 describes a read operation of a memory device according to an embodiment of the present disclosure.

FIG. 6 describes a read operation of a memory device according to an embodiment of the present disclosure.

Referring to FIG. 6, the read operation of obtaining data stored in a memory cell included in the memory device 150 will be described. A memory cell among plural memory cells in the memory device 150 can be specified by a selected word line (Select WL) and a first drain select line (DSL0).

The read operation can be performed in the following order: a precharge operation, a data sensing operation, an equalization operation, and a discharge operation. In FIG. 6, the memory device 150 can perform the precharge operation and the data sensing operation until a first time point tE. The memory device 150 can perform the equalization operation from the first time point tE to a second time point tD and perform the discharge operation after the second time point tD. Time sections for performing all of the precharge operation, the data sensing operation, the equalization operation, and the discharge operation may be designed so as not to exceed an operation margin of the read operation. If a time section required for one of the precharge operation, the data sensing operation, the equalization operation, and the discharge operation could be reduced, the operation margin of the read operation could also be reduced. Through this, a data input/output speed of the memory device 150 could be improved.

During the read operation, a ground voltage (i.e., 0V) can be applied to a source line (SL). Before the first time point tE, the first drain select line (DSL0) may be activated, and a pass voltage (VPASS rising) may be applied to an unselected word line (Unselect WL).

After applying the pass voltage (VPASS rising) to the selected word line (Select WL), the memory device 150 can perform a first precharge operation on a bit line coupled to the selected memory cell. At this time, the memory device 150 can apply a first low voltage which is lower than the pass voltage to the selected word line (Select WL). Here, the first low voltage may be set to a voltage low enough to prevent the memory cell coupled to the selected word line (Select WL) from being turned on. For example, the ground voltage can be applied to the selected word line (Select WL).

Thereafter, the memory device 150 can sense data stored in the memory cell by applying a first read voltage to the selected word line (Select WL) (1st READ Sensing). After the first data sensing is completed, the memory device 150 performs a second precharge operation on a bit line connected to the selected memory cell. At this time, the memory device 150 applies a second low voltage lower than the first read voltage to the selected word line (Select WL). Here, the second low voltage may be a negative voltage lower than the ground voltage. To the extent that the first read voltage has a lower level than the pass voltage, the second low voltage can also have a lower level than the first low voltage.

Thereafter, the memory device 150 can sense data stored in the memory cell by applying a second read voltage to the selected word line (Select WL) (2nd READ Sensing). The memory device 150 can store multi-bit data in a specific memory cell, and can sense stored data twice to clarify and specify which threshold voltage distribution the stored data corresponds to. Additionally, according to an embodiment, the second sensing operation can be performed for verifying the first sensing operation to improve an accuracy of sensing data. While the memory device 150 measures an amount of electron (e.g., the change in a voltage level over a channel) in a process of reading data stored in a memory cell, the measured voltage level may not accurately reflect stored data due to various factors. For example, several factors such as memory cell's electron storage state, a temperature, a data retention time, and wear (or damage) of the memory cell could affect a voltage measurement. For these reasons, in order to confirm the accuracy of the data obtained by the first sensing operation, the second sensing operation can be performed on a same memory cell. If two data obtained by the first and second sensing operations are matched (i.e., be equal), the memory device 150 could determine that the accuracy of the sensing operation is guaranteed.

When two times data sensing is completed up to the first time point tE, the memory device 150 may perform an equalization operation in a channel formed over a cell string including a sensed memory cell. At the first time point tE, the memory device 150 can deactivate the first drain select line DSL0 and apply a voltage to the selected word line (Select WL) and the unselected word line (Unselect WL), although the voltage has a lower level than the pass voltage. A preset voltage having a higher level than the read voltage could be applied. Through this, a potential difference in the channel formed over the corresponding cell string could disappear (e.g., a voltage difference in the channel could be gone).

Thereafter, the memory device 150 performs a discharge operation by applying a ground voltage (0V) to the selected word line (Select WL) and the unselected word line (Unselect WL).

Figure 7:
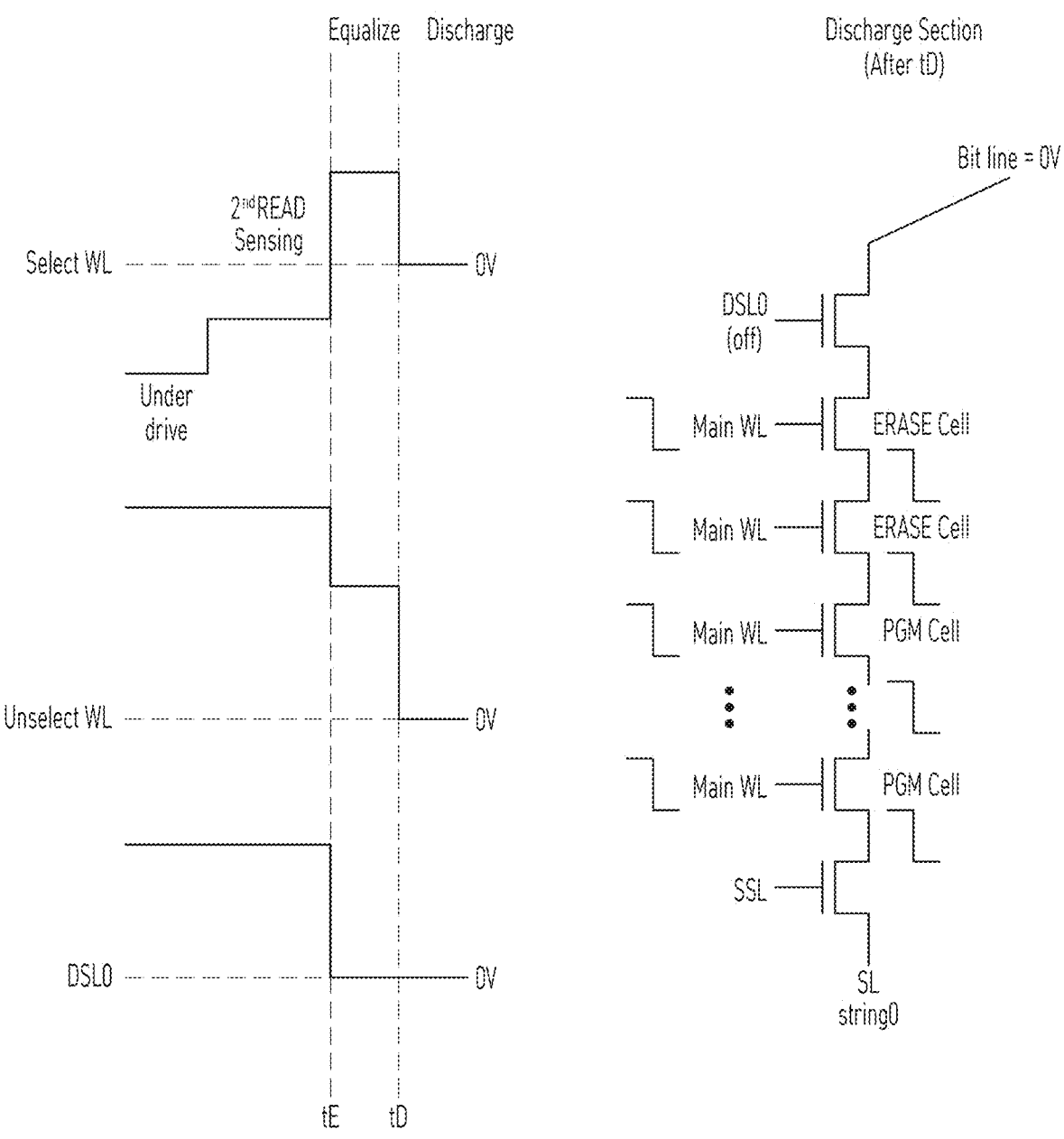
FIG. 7 illustrates an example in which a hot carrier injection (HCI) effect does not occur in a cell array according to an embodiment of the present disclosure.
Figure 8:
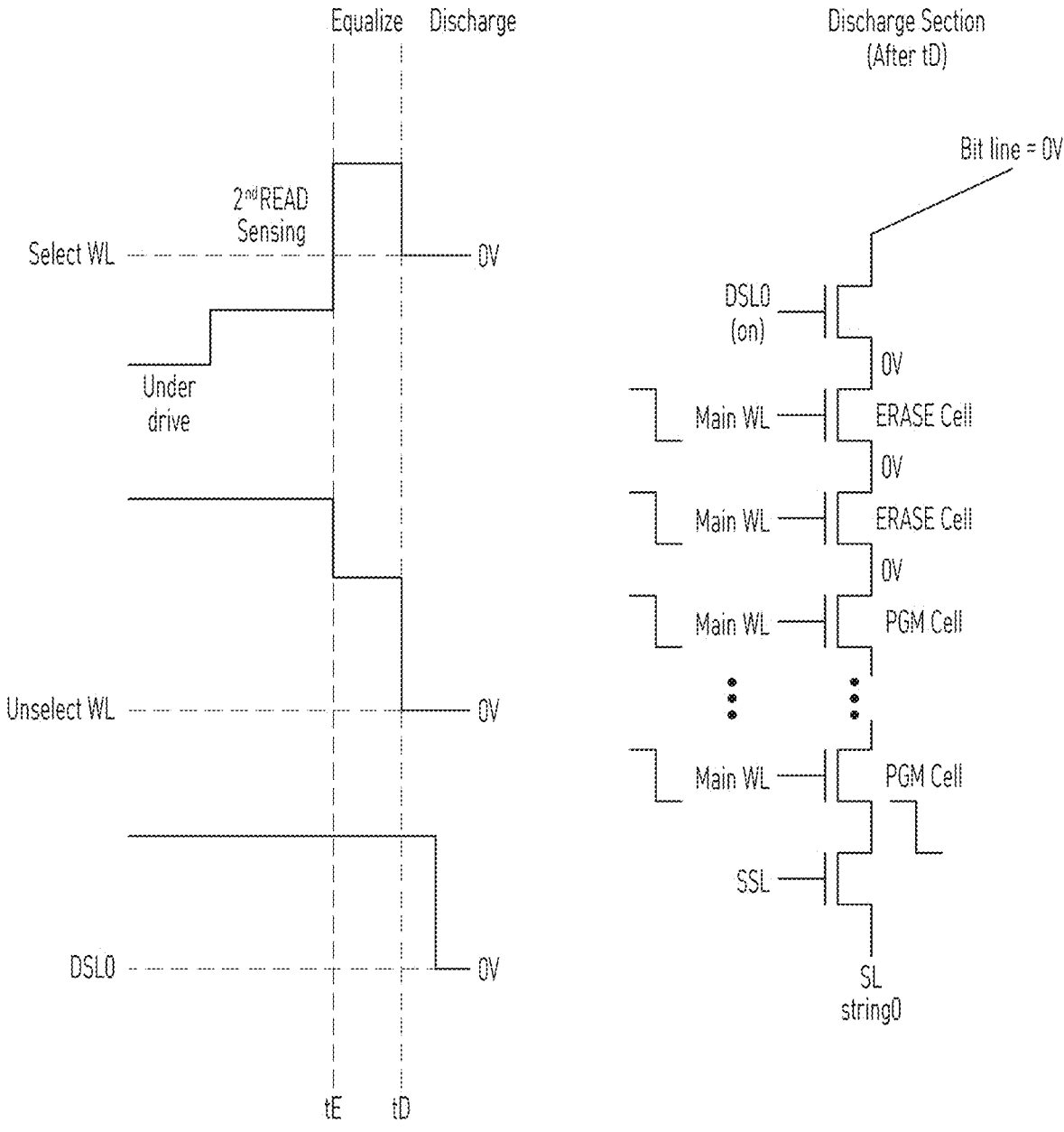
FIG. 8 illustrates an example in which the hot carrier injection (HCI) effect occurs in the cell array according to an embodiment of the present disclosure.

FIG. 7 illustrates an example in which a hot carrier injection (HCI) effect does not occur in a cell array according to an embodiment of the present disclosure, and FIG. 8 illustrates an example in which the hot carrier injection (HCI) effect occurs in the cell array according to an embodiment of the present disclosure. Specifically, FIGS. 7 and 8 describe how the equalization operation of the read operation described in FIG. 6 can vary depending on a control of the first drain select line DSL0 in more detail.

Referring to FIGS. 6 and 7, the memory device 150 can deactivate (e.g., turn off) the first drain select line (DSL0) at the first time point (tE). When the first drain select line (DSL0) is deactivated, an electrical connection between a bit line and a cell string (string0) including a plurality of memory cells can be cut off. The plurality of memory cells included in the cell string (string0) may include a first memory cell (PGM Cell) having a program state and a second memory cell (ERASE Cell) having an erase state.

Referring to FIG. 7, when the ground voltage (i.e., 0V) is applied to the first drain select line (DSL0) faster than the selected word line (Select WL) and the unselected word line (Unselect WL), the channel formed in the cell string (string0) can be in a floating state. Thereafter, during the discharge operation performed at the second time point (tD), the ground voltage (i.e., 0V) can be applied to all word lines (i.e., selected word lines (Select WL) and unselected word lines (Unselect WL)) in the floating channels. Accordingly, no voltage difference occurs in the channel. That is, because a voltage difference depending on positions of memory cells included in the cell string (string0) may not occur, generation of hot carriers in the channel could be reduced or suppressed.

Referring to FIGS. 6 and 8, the memory device 150 is unable to deactivate (e.g., turn off) the first drain select line (DSL0) at the first time point (tE). The first drain select line (DSL0) may be activated until the second time point tD has passed. While the first drain select line (DSL0) is activated, the electrical connection between the cell string (string0) including a plurality of memory cells and the bit line could be maintained. The plurality of memory cells included in the cell string (string0) may include a first memory cell (PGM Cell) having a program state and a second memory cell (ERASE Cell) having an erase state.

Referring to FIG. 8, if the first drain select line (DSL0) is not deactivated at the second time point (tD), the first drain select line (DSL0) could be activated even after the ground voltage (i.e., 0V) is applied to the selected word line (Select WL) and the unselected word line (Unselect WL) at the second time point (tD). In this case, while performing the discharge operation, a part of the channel where the second memory cell (ERASE Cell) having an erased state is located may be detected as 0V. Even if the ground voltage (i.e., 0V) is applied to the second memory cell (ERASE Cell) having the erase state coupled to the unselected word line (Unselect WL), the first memory cell (ERASE Cell) could be turned on. This phenomenon could occur because the threshold voltage distribution of the second memory cell (ERASE Cell) in the erase state may be lower than the ground voltage (i.e., 0V). In this case, a potential difference may occur between positions of the first memory cell (PGM Cell) and the second memory cell (ERASE Cell) in the channel formed over the cell string (string0). Potential differences (e.g., voltage differences) in the channel can cause hot carriers. For this reason, a hot carrier injection (HCI) effect or read disturbance may occur, so that operational safety and durability of the memory device 150 may deteriorate.

Figure 9:
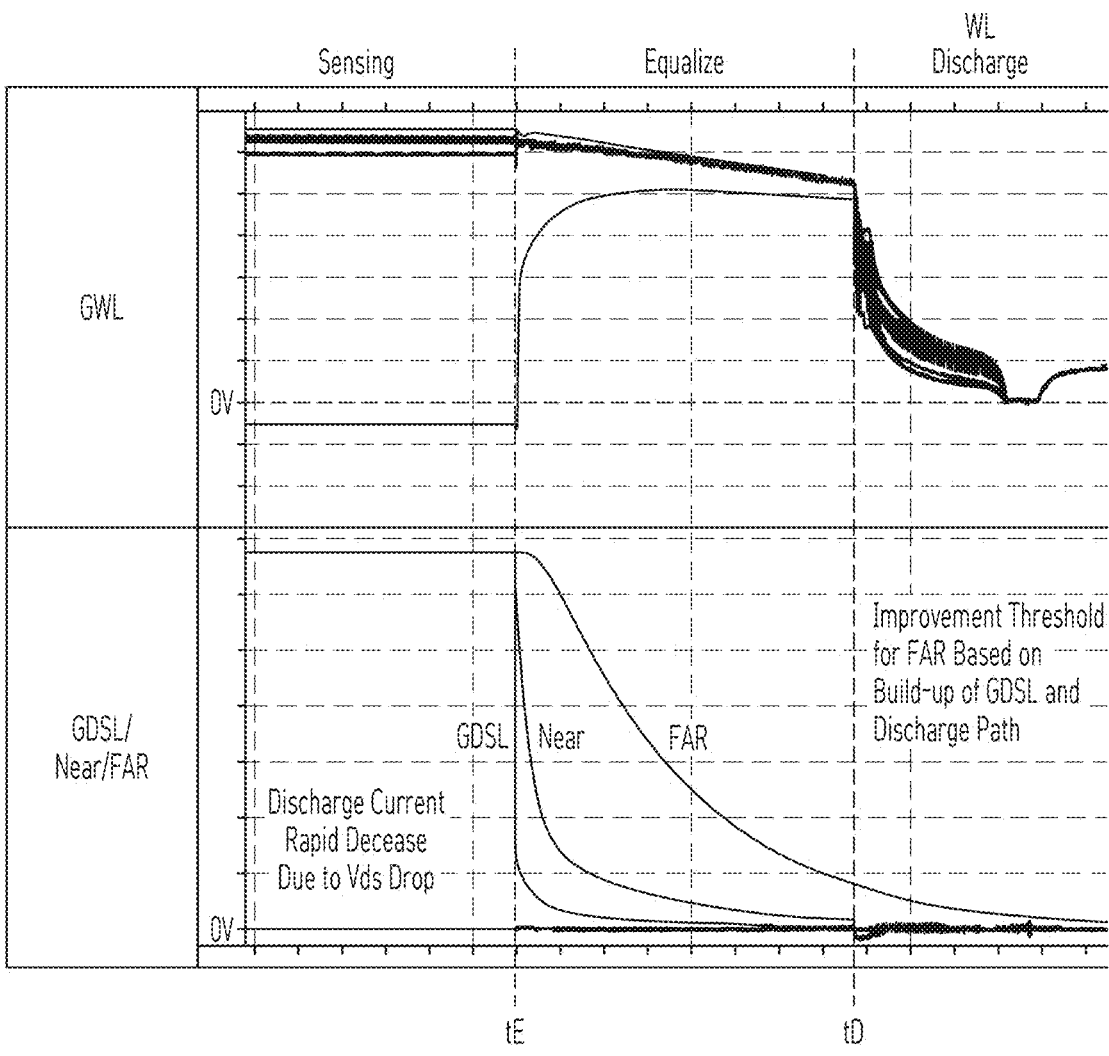
FIG. 9 describes reduction of the hot carrier injection (HCI) effect in a cell array during a read operation.

FIG. 9 describes reduction of the hot carrier injection (HCI) effect in a cell array during a read operation. Specifically, FIG. 9 shows potential changes (e.g., changes in voltage levels) at a global word line (GWL), a global drain select line (GDSL), and local drain select lines including a physically nearby drain select line (Near) and a physically faraway drain select line (FAR) from a cell string on which a read operation was performed.

Referring to FIGS. 6 and 9, a potential of the global word line (GWL) can begin to decrease when the sensing operation is completed and be lowered to the ground voltage (0V) during a discharge operation. During the discharge operation, there may be a delay in lowering the potential of the global word line (GWL) to the ground voltage (i.e., 0V).

When the sensing operation is completed, the potential of the global drain select line (GDSL) may be lowered to the ground voltage (0V). However, the potential change in a plurality of local drain select lines coupled to the global drain select line (GDSL) may occur more slowly than the potential change in the global drain select line (GDSL). Further, a speed of the potential change may become slower, as the potential in the plurality of local drain select lines approaches the ground voltage (i.e., 0V).

In order to reduce or suppress the hot carrier injection (HCI) effect or read disturbance, the memory device 150 can decrease a potential of the selected word line (Select WL) and the unselected word line (Unselect WL) (e.g., apply the ground voltage (i.e., 0V) to word lines), after the physically faraway drain select line (FAR) among the plurality of local drain select lines is lowered to the ground voltage (i.e., 0V). However, referring to FIG. 9, the physically faraway drain select line (FAR), which is physically distant from the cell string on which the read operation was performed, may not be lowered to the ground voltage (i.e., 0V) during the equalization operation performed from the first time point (tE) to the second time point (tD). To solve this issue, if the equalization operation is performed for a longer time section (i.e., when the second time point (tD) is delayed), the discharge operation would be delayed, so that more operation margin for the read operation may be needed. That is, the data input/output performance of the memory device 150 may deteriorate.

To ensure that the global drain select line (GDSL) and the plurality of local drain select lines, including the physically nearby drain select line (Near) and the physically faraway drain select line (FAR), are lowered to the ground voltage (i.e., 0V) more quickly, a resistance at a pad or a location where the ground voltage (i.e., 0V) is applied could be reduced. However, even if the resistance at the pad or the location where the ground voltage (i.e., 0V) is applied is reduced, there may be a limit to reducing a time required for the potential to be lowered at the physically faraway drain select line (FAR).

In addition, when the memory device 150 includes more terminals and more switches for applying the ground voltage (i.e., 0V) to each of the plurality of local drain select lines, an integration degree of the memory device 150 would be reduced. Further, operational complexity could increase due to a control of the more terminals or the more switches in the memory device 150.

Hereinafter, before the discharge operation starting at the second point in time (tD) begins, the memory device 150 capable of lowering potentials of the global drain select line (GDSL) and the plurality of local drain select lines to at least 1V or the ground voltage (i.e., 0V) will be described.

Figure 10:
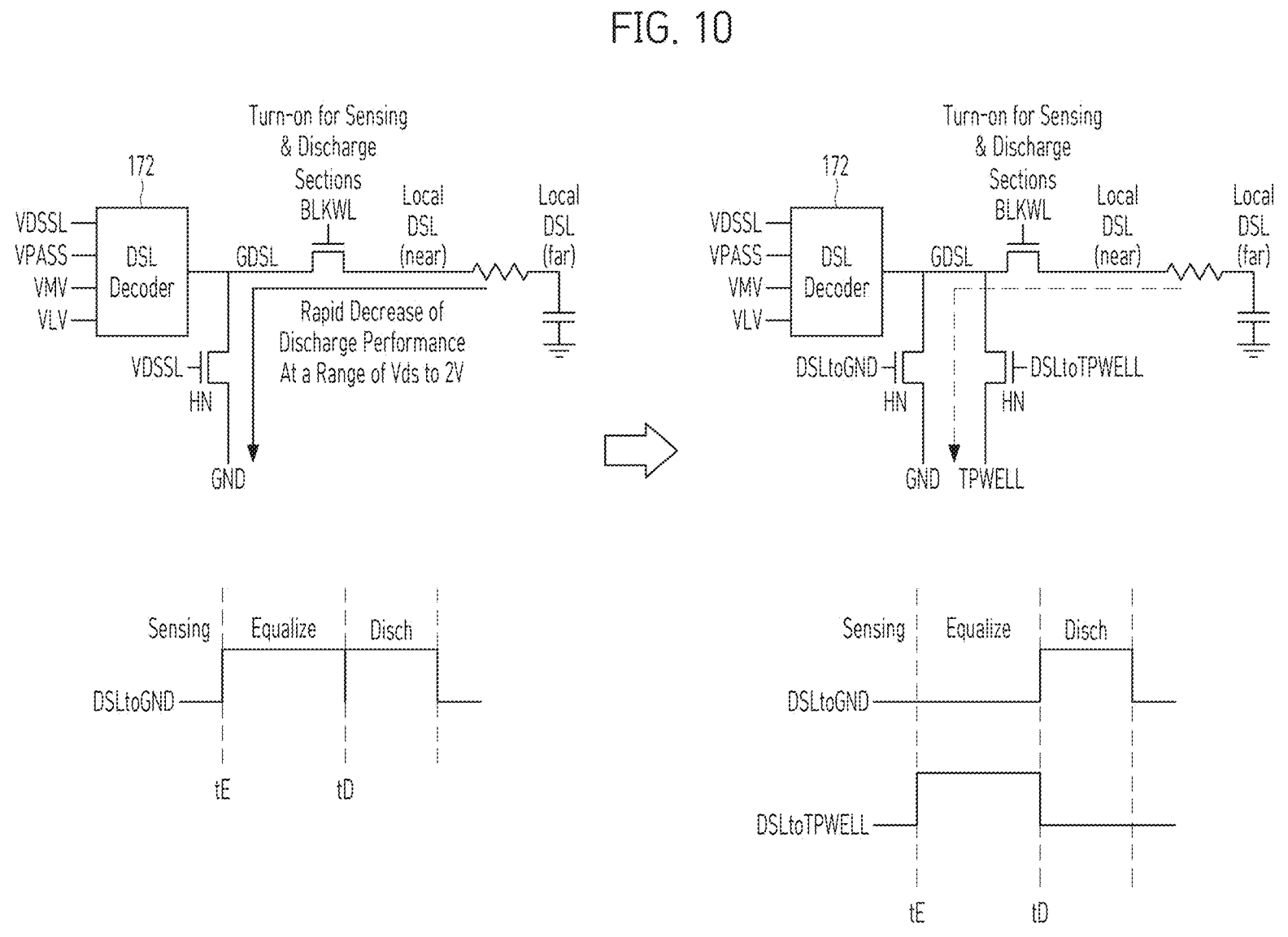

FIG. 10 describes changes in configuration and operation method of a memory device according to an embodiment of the present disclosure.

Referring to FIG. 10, the memory device 150 may include a drain select line decoder 172. According to an embodiment, the drain select line decoder 172 may be implemented through, or included in, the voltage supply circuit 170 or the control circuit 180 described in FIG. 1.

The drain select line decoder 172 may receive a select line control signal (VDSSL) for controlling the drain select line (DSL) and the source select line (SSL), a pass voltage control signal (VPASS), an internal supply voltage (VMV), and a reference voltage (VLV) for checking voltage detection (e.g., low power detection), and output a preset voltage to the global drain select line (GDSL).

The global drain select line (GDSL) and the plurality of local drain select lines (Local DSL) in the memory device 150 may be electrically connected or disconnected through a switch. According to an embodiment, the switch can include a transistor whose operation is controlled by a memory block word line (BLKWL). At this time, the memory block word line BLKWL can be activated during the sensing operation or the discharge operation in the read operation performed in a corresponding cell string of the cell array 330. The plurality of local drain select lines (Local DSL) can include the physically nearby drain select line (Near) and the physically faraway drain select line (FAR) from the corresponding cell string. A resistance difference may exist depending on physical locations of the plurality of local drain select lines (Local DSL).

When the sensing operation (Sensing) is completed and the first time point (tE) is reached, the global drain select line (GDSL) can be coupled to a terminal or a pad of the ground voltage (GND, i.e., 0V) by a drain select line discharge signal (DSLtoGND). The drain select line discharge signal (DSLtoGND) can be activated while the equalization operation (Equalize) and the discharge operation (Disch) are performed in the cell array 330.

However, there is the resistance difference between the plurality of local drain select lines (Local DSL). As shown in FIG. 9, a speed of the potential change occurring at the farthest physical location among the plurality of local drain select lines (Local DSL) may not be fast. To solve this issue, two discharge paths can be coupled to the global drain select line (GDSL).

According to an embodiment, the global drain select line (GDSL) can be connected to two discharge paths including two switches (HN). The first switch may include a transistor controlled by the drain select line discharge signal (DSLtoGND), and the second switch may include a transistor controlled by a drain select line well connection signal (DSLtoTPWELL). The first switch can be turned on during the discharge operation (Disch) begun at a second time point (tD). However, the second switch can be turned on during the equalization operation (Equalize) performed between the first time point (tE) and the second time point (tD).

Specifically, during the equalization operation (Equalize), the second switch can couple the global drain select line (GDSL) to the P-type well (TPWELL). Like the P-type well (TPWELL) described in FIG. 5, a negative voltage (i.e., a voltage lower than the ground voltage GND) could be applied to the P-type well (TPWELL) during the equalization operation (Equalize). Compared to a case where the global drain select line (GDSL) is coupled only to the terminal of the ground voltage (GND), potential changes in the global drain select lines (GDSL) and the plurality of local drain select lines (Local DSL) could occur more quickly in the embodiment in which the global drain select line (GDSL) is coupled to the terminal of the ground voltage (GND) as well as the P-type well (TPWELL) to which a negative voltage is applied.

During the discharge operation (Disch) after the equalization operation (Equalize), the global drain select line (GDSL) could be coupled to the terminal of the ground voltage (GND) rather than a terminal of the negative voltage. Accordingly, it is possible to avoid lowering the potentials of the global drain select line (GDSL) and the plurality of local drain select lines (Local DSL) coupled to the global drain select line (GDSL) to the negative voltage or under the ground voltage (GND). A time required for lowering the potentials of the plurality of local drain select lines (Local DSL) to the ground voltage (i.e., 0V) could be reduced.

Figure 11:
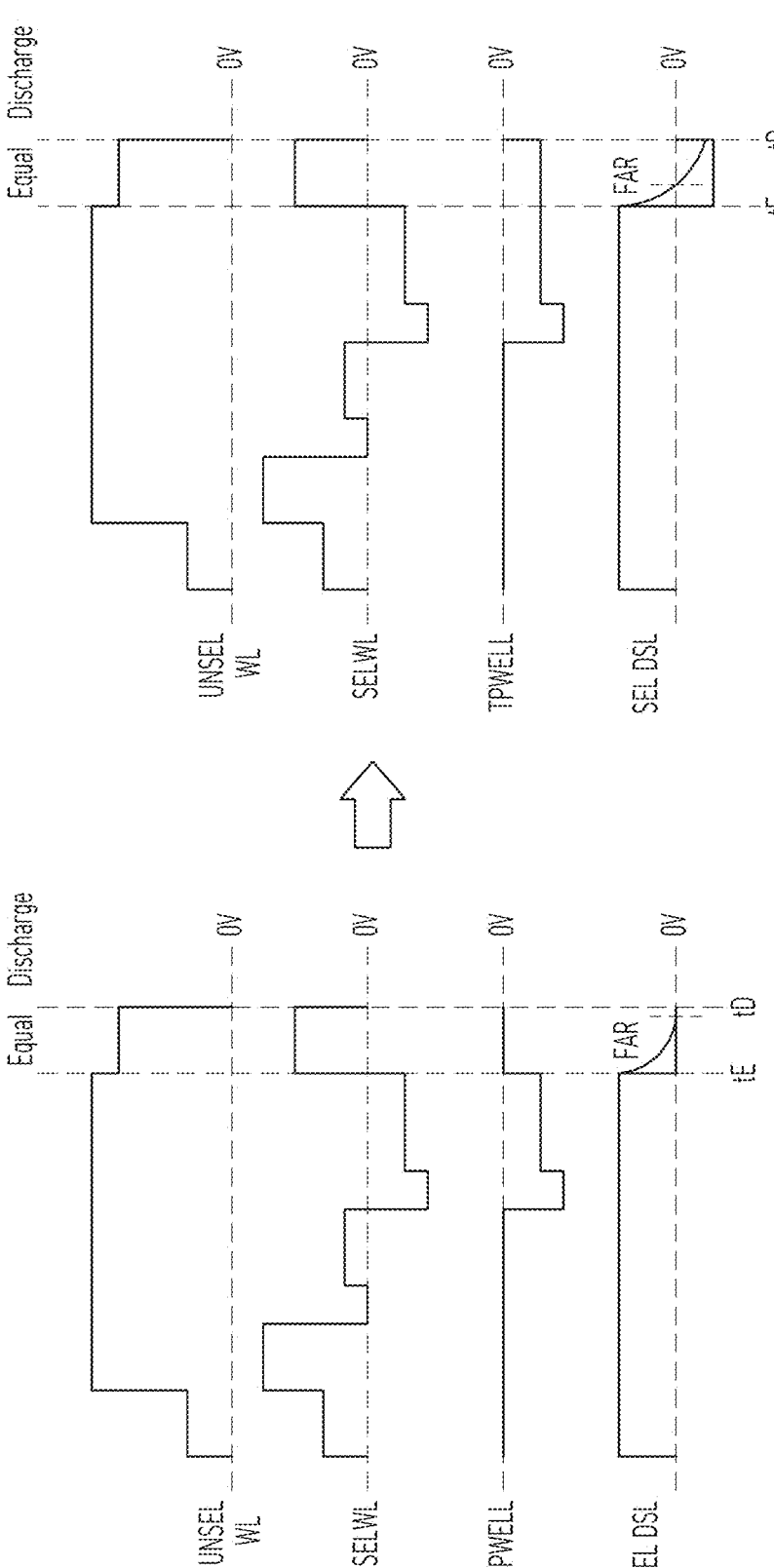
FIG. 11 describes a read operation according to the change in configuration of the memory device described in FIG. 10.

FIG. 11 describes a read operation according to the change in configuration of the memory device described in FIG. 10. Specifically, FIG. 11 shows in detail the equalization operation (Equal) and the discharge operation (Discharge) that may be changed based on the change in the configuration of the memory device described in FIG. 10. Here, the equalization operation (Equal) and the discharge operation (Discharge) may be included in the read operation described in FIG. 6.

Referring to FIGS. 10 and 11, after data is sensed twice during the sensing operation, the equalization operation (Equal) may be begun at a first time point (tE). During the equalization operation (Equal), a preset voltage having a lower level than the pass voltage can be applied to the selected word line (SEL WL) and the unselected word line (UNSEL WL), so that the memory device 150 can reduce or eliminate a potential difference in the channel formed in a cell string in which the sensing operation is performed.

First, when there is a single discharge path coupled to the global drain select line (GDSL) in the memory device 150, the selected drain select line (SEL DSL) can be coupled to the terminal of the ground voltage (i.e., 0V) at the first time point (tE) when the equalization operation (Equal) starts. At this time, as described in FIGS. 9 and 10, a speed of potential change may not be fast at the physically faraway drain select line (FAR) among the plurality of local drain select lines (Local DSL). Thus, the second time point (tD) when the discharge operation (Discharge) is begun could be delayed after the potential of the physically faraway drain select line (FAR) among the plurality of local drain select lines (Local DSL) lowers to the ground voltage (i.e., 0V).

However, when there are two discharge paths coupled to the global drain select line (GDSL) in the memory device 150, the memory device 150 may couple the global drain select line (GDSL) to the P-type well (TPWELL) to which a negative voltage is applied at the first time point (tE) when the equalization operation (Equal) starts. Because a rate of potential change can be faster at the physically faraway drain select line (FAR) among the plurality of local drain select lines (Local DSL), a time point when the potential of the physically faraway drain select line (FAR) among the plurality of local drain select lines (Local DSL) becomes lowered to the ground voltage (i.e., 0V) could become faster. Thus, the second time point (tD) when the discharge operation starts could be brought forward accordingly.

Figure 12:
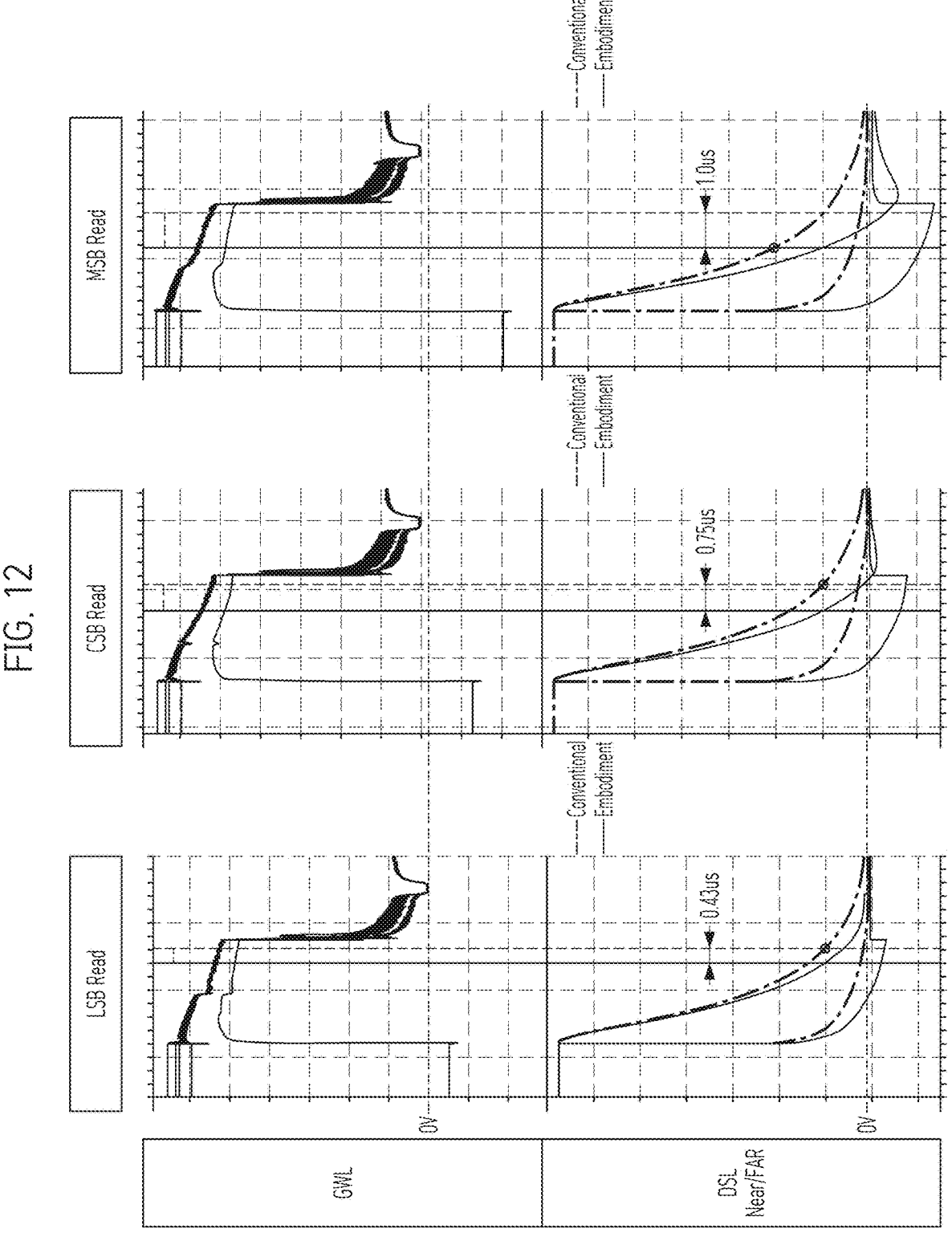
FIG. 12 describes reduction of the effect of hot carrier injection (HCI) in the cell array within the memory device described in FIG. 10.

FIG. 12 describes reduction of the effect of hot carrier injection (HCI) in the cell array within the memory device described in FIG. 10. Specifically, FIG. 12 shows the potential change (change in voltage level) at the global word line (GWL), global drain select line (GDSL), and the physically nearby drain select line (Near) and the physically faraway drain select line (FAR) among the plurality of local drain select lines (Local DSL) during the sensing operation, the equalization operation, and the discharge operation. The physically nearby drain select line (Near) and the physically faraway drain select line (FAR) can be drain select lines which are the closest or farthest from the cell string on which the read operation was performed. In addition, FIG. 12 shows a read operation (e.g., LSB Read, CSB read, MSB Read) for obtaining specific-bit data among multi-bit data stored in the cell array including a memory cell capable of storing the multi-bit data, e.g., data of least significant bit (LSB), center significant bit (CSB), and the most significant bit (MSB).

Referring to FIG. 12, there is a single discharge path coupled to the global drain select line (GDSL) in the memory device 150 (a conventional device) and two discharge paths coupled to the global drain select line (GDSL) in the memory device 150 (an embodiment of the present disclosure). There is a difference in times required for a potential change or voltage change between the conventional device and the embodiment of the present disclosure.

First, in the read operation (LSB Read) of reading data of the least significant bit (LSB) stored in a memory cell, the time it takes for the voltage level of the physically faraway drain select line (FAR) among the plurality of local drain select lines (Local DSL) to be lowered to the ground voltage (i.e., 0V) could be reduced by approximately 0.43 μs.

In addition, in the read operation (CSB Read) of reading data of the center significant bit (CSB) stored in a memory cell, the time it takes for the voltage level of the physically faraway drain select line (FAR) among the plurality of local drain select lines (Local DSL) to be lowered to the ground voltage (i.e., 0V) could be reduced by approximately 0.75 μs.

In addition, in the read operation (MSB Read) of reading data of the most significant bit (MSB) stored in a memory cell, the time required for the voltage level of the physically faraway drain select line (FAR) among the plurality of local drain select lines (Local DSL) to be lowered to the ground voltage (i.e., 0V) could be reduced by approximately 1.0 μs.

Referring to FIG. 12, in a case of the read operation regarding a TLC memory cell, the time can be reduced by about 0.43 μs/0.75 μs/1.0 μs in the read operation for data of LSB/CSB/MSB. These measurements can indicate that the time for the equalization operation may decrease on average by about 0.73 us.

Further, according to an embodiment, in a case of the read operation regarding a QLC memory cell, the time may be reduced by about 1.3 μs/1.1 μs/0.85 μs/0.75 μs in the read operation for data of LSB/CSB/MSB/QSB. These measurements can indicate that the time for the equalization operation may decrease on average by about 1.0 μs.

If the time spent on the equalization operation could be reduced, the time required for the read operation (e.g., the operation margin for the read operation) could be reduced. Accordingly, the data input/output performance of the memory device 150 could be improved or enhanced.

As above described, the memory device or the memory system including the memory device according to an embodiment of the present disclosure can reduce, avoid, or suppress an effect of hot carrier injection (HCI), improving durability of the memory device or the memory system and improving accuracy of data input/output operations performed within the memory device or the memory system.

Further, the memory device or the memory system according to an embodiment of the present disclosure can increase a speed of discharging charges or electrons from a channel formed in the cell array, thereby reducing an operating margin set for a data input/output operation and improving an operation speed of the data input/output operation.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods or operations of the computer, processor, controller, or other signal processing device, are described in detail, the code or instructions for implementing the operations of the method embodiments may transform the computer, processor, controller, or other signal processing device into a special-purpose processor for performing the methods herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments or operations of the apparatus embodiments herein.

The controllers, processors, control circuitry, devices, modules, units, multiplexers, logics, interfaces, decoders, drivers, generators and other signal generating and signal processing features of the embodiments disclosed herein may be implemented, for example, in non-transitory logic that may include hardware, software, or both. When implemented at least partially in hardware, the controllers, processors, control circuitry, devices, modules, units, multiplexers, logics, interfaces, decoders, drivers, generators and other signal generating and signal processing features may be, for example, any of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, processors, control circuitry, devices, modules, units, multiplexers, generators, logics, interfaces, decoders, drivers, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods or operations of the computer, processor, microprocessor, controller, or other signal processing device, are described in detail, the code or instructions for implementing the operations of the method embodiments may transform the computer, processor, controller, or other signal processing device into a special-purpose processor for performing the methods described herein.

While the present teachings have been illustrated and described with respect to the specific embodiments, it will be apparent to those skilled in the art in light of the present disclosure that various changes and modifications may be made without departing from the spirit and scope of the present disclosure as defined in the following claims. Furthermore, the embodiments may be combined to form additional embodiments.

What is claimed is:

1. A memory device comprising:
a cell array in which electronic connection between a bit line and a cell string comprising plural memory cells is controlled by a drain select line (DSL); and
a control circuit configured to, during a read operation, sense data stored in a selected cell among the plural memory cells in the cell string and apply a first negative voltage to the drain select line while performing equalization for the plural memory cells.

2. The memory device according to claim 1, wherein the cell array comprises:
a global drain select line coupled to plural drain select lines including the drain select line; and
a first switch configured to selectively couple the global drain select line to a P-type well in which the plural memory cells are formed.

3. The memory device according to claim 2, wherein the P-type well is formed in a N-type well included in a P-type substrate.

4. The memory device according to claim 2, wherein the control circuit is configured to apply a second negative voltage to the P-type well while performing the equalization for the plural memory cells.

5. The memory device according to claim 4, wherein the first negative voltage and the second negative voltage have a same level.

6. The memory device according to claim 2, further comprising a second switch configured to selectively couple the global drain select line to a ground voltage,
wherein the control circuit is configured to apply the ground voltage to the global drain select line through the second switch after performing the equalization for the plural memory cells.

7. The memory device according to claim 1, wherein the control circuit is configured to apply a ground voltage to the drain select line for discharging a channel of the cell string after performing the equalization for the plural memory cells.

8. The memory device according to claim 1, wherein the control circuit is configured to:
apply two read voltages having different levels to a selected word line coupled to the selected cell for sensing the data; and
apply a pass voltage to unselected word lines while the two read voltages are applied to the selected word line.

9. The memory device according to claim 8, wherein the control circuit is configured to apply a preset voltage having a lower level than the pass voltage to the selected word line and the unselected word lines while performing the equalization for the plural memory cells.

10. The memory device according to claim 8, wherein the control circuit is configured to apply a ground voltage to the selected word line and the unselected word lines for discharging a channel of the cells string after performing the equalization for the plural memory cells.

11. A method for operating a memory device, the method comprising:
performing a read operation through:
sequentially applying two read voltages having different levels to a selected word line coupled to a selected memory cell among plural memory cells to sense data stored in the selected memory cell; and
applying a first negative voltage to a drain select line while performing equalization for the plural memory cells.

12. The method according to claim 11, further comprising:
applying an activation voltage to the drain select line to couple the selected memory cell to a bit line while the data is sensed.

13. The method according to claim 11, further comprising:
coupling the drain select line to a global drain select line at a timing of starting the equalization for the plural memory cells, and applying a second negative voltage to a P-type well in which a transistor coupled to the drain select line is formed, while performing the equalization for the plural memory cells.

14. The method according to claim 13, wherein the first negative voltage and the second negative voltage have a same level.

15. The method according to claim 13, further comprising, after performing the equalization for the plural memory cells:
applying a ground voltage to the selected word line, the drain select line, and the P-type well to discharge charges in a channel formed on the plural memory cells.

16. A memory device comprising:
plural drain select lines coupled to plural cell strings, respectively;
a global drain select line coupled to the plural drain select lines;
a first switch configured to selectively couple the global drain select line to a P-type well in which a transistor coupled to at least one of the plural drain select lines is formed; and
a second switch configured to selectively apply a ground voltage to the global drain select line during a read operation.

17. The memory device according to claim 16, further comprising:
a control circuit configured to sense data stored in a selected cell of the selected cell string and apply a first negative voltage to a selected drain select line while performing equalization for a selected cell string coupled to the selected drain select line.

18. The memory device according to claim 17, wherein the control circuit is configured to turn on the first switch and turn off the second switch while performing the equalization for the selected cell string.

19. The memory device according to claim 17, wherein the control circuit is configured to turn off the first switch and turn on the second switch for discharging a channel of the selected cell string after performing the equalization for the selected cell string.

20. The memory device according to claim 19,
wherein the P-type well is formed in a N-type well included in a P-type substrate, and
wherein the control circuit is configured to apply a second negative voltage to the P-type well while performing the equalization for the selected cell string.

* * * * *